United States Patent [19]

Hasegawa

[11] Patent Number: 4,842,983

[45] Date of Patent: Jun. 27, 1989

[54] LIGHT-SENSITIVE COMPOSITIONS AND LIGHT-SENSITIVE MATERIALS WITH PHENOLIC RESOL HAVING DIBENZYLIC ETHER LINKAGES

[75] Inventor: Akira Hasegawa, Shizuoka, Japan

[73] Assignee: Fuji Photo Film Co., Ltd., Minami-ashigara, Japan

[21] Appl. No.: 108,278

[22] Filed: Oct. 14, 1987

Related U.S. Application Data

[62] Division of Ser. No. 842,217, Mar. 21, 1986, Pat. No. 4,732,840.

[30] Foreign Application Priority Data

Mar. 22, 1985 [JP] Japan .................................. 60-57797
Mar. 22, 1985 [JP] Japan .................................. 60-57798
Apr. 1, 1985 [JP] Japan .................................. 60-68661

[51] Int. Cl.⁴ .......................... G03C 1/60; G03C 1/68; G03C 1/495
[52] U.S. Cl. .................................. 430/175; 430/176; 430/190; 430/192; 430/197; 430/270; 430/281; 430/286; 430/287; 430/302
[58] Field of Search .............. 430/175, 176, 192, 197, 430/270, 281, 286, 287, 190, 302

[56] References Cited

U.S. PATENT DOCUMENTS

| | | | |
|---|---|---|---|
| 3,485,797 | 12/1969 | Robins | 528/139 |
| 3,635,709 | 1/1972 | Kobayashi | 430/190 |
| 3,666,473 | 5/1972 | Colom et al. | 430/326 |
| 3,676,392 | 7/1972 | Robins | 528/139 |
| 4,079,031 | 3/1978 | Sardessai et al. | 524/442 |
| 4,536,464 | 8/1985 | Nagashima et al. | 430/302 |
| 4,612,254 | 9/1986 | Ginter et al. | 428/531 |

FOREIGN PATENT DOCUMENTS

| | | | |
|---|---|---|---|
| 118291 | 9/1984 | European Pat. Off. | 430/326 |
| 52-71224 | 6/1977 | Japan | 430/330 |
| 1154749 | 6/1969 | United Kingdom | 430/302 |
| 2082339 | 3/1982 | United Kingdom | 430/302 |

Primary Examiner—Charles L. Bowers, Jr.
Attorney, Agent, or Firm—Burns, Doane, Swecker & Mathis

[57] ABSTRACT

A light-sensitive composition comprising a phenolic resol wherein the ratio of the number of dibenzylic ether linkages to the total number of dibenzylic ether, methylene and methylol linkages linked to phenolic nucleus is 15 mol. % or more and which is obtained by a reaction between a phenol of the formula (I):

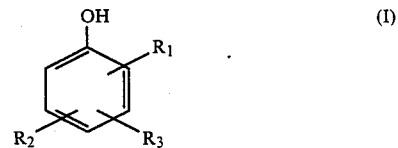

wherein $R_1$, $R_2$ and $R_3$ may be the same or different and represent hydrogen, halogen, hydroxyl, nitro, alkyl, alkoxy, phenyl, or substituted phenyl, and an aldehyde or ketone.

A light-sensitive composition comprising a condensate of the phenolic resol and an o-quinone diazido sulfonylhalide.

A light-sensitive material comprising the above-mentioned composition.

A method for making a planographic printing plate from the light-sensitive material, characterized in that burning-in process is carried out at a lower temperature or a shortened time.

8 Claims, No Drawings

LIGHT-SENSITIVE COMPOSITIONS AND LIGHT-SENSITIVE MATERIALS WITH PHENOLIC RESOL HAVING DIBENZYLIC ETHER LINKAGES

This application is a divisional of application Ser. No. 842,217, filed Mar. 21, 1986, now U.S. Pat. No. 4,732,840.

FIELD OF THE INVENTION

This invention relates generally to a light-sensitive composition and a light-sensitive material, and particularly to a light-sensitive composition for use in making presensitized plate from which planographic printing plates can be made, various light-sensitive films or resists for integrated circuits and a light-sensitive material comprising the same.

This invention relates further to a method for making a planographic printing plate by image-wise exposing and then developing the light-sensitive material, followed by heat treatment.

DESCRIPTION OF THE PRIOR ART

Light-sensitive compositions comprising o-napthoquinone diazide compound and phenolic novolak are very useful as light-sensitive compositions for a planographic printing plate or photoresist and have been widely used.

However, phenolic novolak which is a main component of such light-sensitive compositions is poor in adhesion properties to a support, gives a brittle coating, is inferior in coating property and abrasion resistance, and is poor in printing durability when it is used in a printing plate, and therefore it cannot universally be applied.

For solving such problems, various high molecular compounds have been proposed as binders. For example, when a polyhydroxystyrene or hydroxystyrene copolymer as disclosed in Japanese Patent Publication No. Sho 52-41050 is used as a binder, film-forming properties are in fact improved but abrasion resistance still remains poor. Japanese Patent Application (opened to public inspection, hereinafter referred to as OPI) No. Sho 51-34711 discloses the use of a high molecular compound having a structural unit of acrylic acid derivative in its molecular structure, as a binder. However, light sensitive compositions comprising the high molecular compound are disadvantageous in that they show narrow range in appropriate developing condition, i.e., they have small latitude in development.

Methods for heat-hardening image areas of the light-sensitive material after image-wise exposure and development thereof (so-called burning-in process) to thereby increase printing durability thereof are described in, for example, British Pat. Nos. 1,151,199 and 1,154,749. This heat treatment is conducted at a temperature of above 180° C., typically 220° C. to 260° C., for 5 minutes to 60 minutes. However, if such high temperature treatment is applied to a light-sensitive material comprising a support having coated thereon a light-sensitive compound and a phenolic novolak or resol as a binder, the composition in image areas undergoes pyrolysis. As a result, non-image areas are contaminated, which leads to contamination on the printed matter.

Contamination in non-image areas is more remarkable when a light-sensitive material comprising phenolic novolak requiring heat treatment at a relatively high temperature for hardening is used. For removing the contamination in non-image areas, there has been proposed the use of a certain active solution which is liable to spoil image areas. For avoiding this, as described in Canadian Pat. Nos. 1,061,160 and 1,084,758, there also has been proposed a method wherein, prior to heat treatment, a layer of water soluble organic compound or water soluble inorganic salt is coated in order to avoid contamination in non-image areas or to make it easy to remove pyrolysis products adhered thereto by water washing. However, when it is treated at a higher temperature, an aluminum support conventionally used is liable to be deformed so that it can no longer be used.

Still another method has been proposed wherein a certain compound is added to the light-sensitive composition to thereby lower the temperature at which heat treatment is conducted to 200° C. or below. For example, West German Patent (OLS) No. 3,039,926 discloses a light-sensitive composition comprising a phenol derivative having 2 to 4 hydroxyl groups and Japanese Patent Application (OPI) No. Sho 59-113435 discloses a light-sensitive composition comprising a cyclic acid amide. However, the addition of such compounds deteriorates developing properties of the light-sensitive composition.

On the other hand, the developing properties of a light-sensitive composition comprising phenolic resol degrades with time.

SUMMARY OF THE INVENTION

Accordingly, an object of this invention is to provide light-sensitive composition which has great latitude in development and can give a planographic printing plate having high printing durability.

Another object of this invention is to provide a light-sensitive composition which is good in adhesion properties to a support and gives flexible (i.e., not brittle) coating, and is excellent in stability over time.

Still another object of this invention is to provide a light-sensitive material comprising such light-sensitive composition.

A further object of this invention is to provide a light-sensitive composition which can be hardened at a lower temperature or in a shorter time without degrading an appropriate latitude in development and stability over time.

A still further object of this invention is to provide a method for making a printing plate which gives no contamination on the printed matter and is high in printing durability by using a light-sensitive composition which is good in developing property and stability over time, and which can be hardened at a lower temperature or in a shorter time.

This invention provides a light-sensitive composition comprising phenolic resol wherein the ratio of the number of dibenzylic ether linkages to the total number of dibenzylic ether (i.e., dimethylene ether), methylene and methylol linkages linked to phenolic nucleus is 15 mol. % or more and which is obtained by a reaction between a phenol of the formula (I):

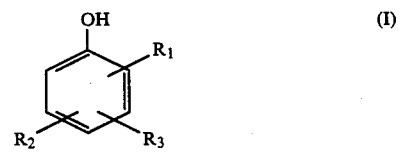

wherein $R_1$, $R_2$ and $R_3$ may be the same or different and represent hydrogen, halogen, hydroxyl, nitro, alkyl having 1 to 20 carbon atoms, alkoxy having 1 to 20 carbon atoms, acyl having 1 to 20 carbon atoms, phenyl having 6 to 20 carbon atoms, or substituted phenyl having 6 to 20 carbon atoms, and an aldehyde or ketone.

This invention also provides a light-sensitive material comprising the light-sensitive composition mentioned above.

This invention further provides a method for making a planographic printing plate, which comprises the steps of image-wise exposing and then developing the light-sensitive material described above, followed by heat treatment at a temperature of 140° C. or above.

This invention also provides a light-sensitive composition comprising a condensation product of o-quinonediazido-sulfonylhalide and the phenolic resol mentioned above.

DETAILED DESCRIPTION OF THE INVENTION

The phenolic resol used in this invention can be obtained by reacting the phenol of the formula (I) with an aldehyde or ketone under neutral or weak acidic condition for 1 to 10 hours at a refluxing temperature, and then removing water under normal or reduced pressure at a temperature of 130° C. or below.

Examples of the phenols of the formula (I) include phenol, cresol, ethylphenol, chlorophenol, m-nitrophenol, p-acetylphenol, p-propionylphenol, p-butyrylphenol, methoxyphenol, p-phenylphenol, p-tolylphenol, 4'-dihydroxydiphenylmethane, 4'-isopropylidenediphenol, cyclohexylphenol, isopropylphenol, tert-butylphenol, n-butylphenol, tert-amylphenol, n-amylphenol, tert-octylphenol, nonylphenol, dodecylphenol, hexylphenol, resorcin, methylresorcin, ethylresorcin, chlororesorcin, methoxyresorcin, phenylresorcin, cyclohexylresorcin, isopropylresorcin, tert-butylresorcin, n-butylresorcin, tert-amylresorcin, n-amylresorcin tert-octylresorcin, nonylresorcin, dodecylresorcin, hexylresorcin, catechol, methylcatechol, ethylcatechol, chlorocatechol, methoxycatechol, phenylcatechol, cyclohexylcatechol, isopropylcatechol, tert-butylcatechol, n-butylcatechol, tert-amylcatechol, n-amylcatechol, tert-octylcatechol, nonylcatechol, dodecylcatechol, hexylcatechol, hydroquinone, methylhydroquinone, ethylhydroquinone, chlorohydroquinone, methoxyhydroquinone, phenylhydroquinone, cyclohexylhydroquinone, isopropylhydroquinone, tert-butylhydroquinone, n-butylhydroquinone, tert-amylhydroquinone, n-amylhydroquinone, tert-octylhydroquinone, nonylhydroquinone, dodecylhydroquinone, hexylhydroquinone, pyrogallol, methylpyrogallol, chloropyrogallol, methoxypyrogallol, ethylpyrogallol, phenylpyrogallol, cyclohexylpyrogallol, isopropylpyrogallol, tert-butylpyrogallol, n-butylpyrogallol, tert-amylpyrogallol, n-amylpyrogallol, tert-octylpyrogallol, nonylpyrogallol, dodecylpyrogallol, hexylpyrogallol, etc.

Examples of suitable aldehydes and ketones include formalin, paraformaldehyde, polyoxymethylene, benzaldehyde, acetone, methyl ethyl ketone, dimethyl ketone, diethyl ketone, acetophenone, methylbenzaldehyde, ethylbenzaldehyde, tert-butylbenzaldehyde, methylacetophenone, benzophenone, methylbenzophenone, dimethylbenzophenone, etc. Of these, formalin, paraformaldehyde and polyoxymethylene are preferred.

The phenolic resols used in this invention are those which are obtained by a condensation reaction between at least one of the phenols and at least one of the aldehydes and/or the ketones.

Examples of catalysts for making the reaction system neutral or weakly acidic include metal naphthenates such as lead naphthenate, manganese naphthenate, zinc naphthenate, etc., metal acetates such as lead acetate, zinc acetate, etc., and metal borates such as lead borate, zinc borate, magnesium borate etc. These catalysts may be used in combination with any conventional catalyst such as an inorganic acid e.g. hydrochloric acid, sulfuric acid, etc. or an organic acid e.g. benzoic acid, salicylic acid, oxalic acid, maleic acid, paratoluenesulfonic acid, etc.

$1_{H\text{-}NMR}$ spectrum analysis shows that the molecular structure of the phenolic resols used in this invention is characterized by the linkage form of aldehyde linked to phenolic nucleus, which consists mainly of dibenzylic ether (i.e. dimethylene ether), methylene and methylol linkage. The phenolic resols used in this invention contain 15 mol. % or more of dibenzylic ether linkages based on the total linkages contained therein.

Typical synthesis examples of the phenolic resols used in this invention and comparative examples will now be illustrated. In this specification, "part" and "%" are by weight unless otherwise indicated.

SYNTHESIS EXAMPLE 1

To a reactor equipped with a stirrer, a reflux condenser and a thermometer, there was charged 1,000 parts of phenol and 480 parts of 80% paraformaldehyde. Zinc naphthenate was added to adjust the pH of the reaction system to 6.0, and then the reaction mixture was heated to a refluxing temperature and maintained for 4.5 hours. Then, under normal pressure, water was distilled off and the mixture was heated to temperature of 115° C. Further, under a reduced pressure of 30 to 45 Torr, the mixture was heated to 123° C. to distill water off. Phenolic resol having benzylic ether linkage was obtained.

SYNTHESIS EXAMPLE 2

To the same reactor as used in SYNTHESIS EXAMPLE 1, there was charged 700 parts of phenol, 300 parts of paracresol and 580 parts of 85% paraformaldehyde. Lead acetate was added to adjust to pH of the reaction system to 6.3, and then the reaction mixture was heated to a refluxing temperature and maintained for 3 hours. Then, under normal pressure, water was distilled off and the mixture was heated to 118° C. Further, under a reduced pressure of 35 to 55 Torr, the mixture was heated to 120° C. to distill water off. Phenolic resol having benzylic ether linkage was obtained.

SYNTHESIS EXAMPLE 3

To the same reactor as used in SYNTHESIS EXAMPLE 1, there was charged 750 parts of phenol, 250 parts of 60% metacresol (containing 40% paracresol), 300 parts of 88% paraformaldehyde and 790 parts of 37% formalin. Manganese naphthenate was added to adjust a pH of the reaction system to 6.5, and then the reaction mixture was heated to a refluxing temperature and maintained for 5 hours. Then, under normal pressure, water was distilled off and the mixture was heated to 115° C. Further, under a reduced pressure of 30 to 45 Torr, the mixture was heated to 123° C. to distill water off. Phenolic resol having benzylic ether linkage was obtained.

SYNTHESIS EXAMPLE 4

To the same reactor as used in SYNTHESIS EXAMPLE 1, there was charged 1,000 parts of 60% metacresol (containing 40% paracresol), 480 parts of 80% paraformaldehyde and 790 parts of 37% formalin. Zinc naphthenate was added to adjust the pH of the reaction system to 6.0, and then the reaction mixture was heated to a refluxing temperature and maintained for 4.5 hours. Then, under normal pressure, water was distilled off and the mixture was heated to 115° C. Further, under a reduced pressure of 30 to 45 Torr, the mixture was heated to 123° C. to distill water off. Phenolic resol having benzylic ether linkage was obtained.

SYNTHESIS EXAMPLE 5

To the same reactor as used in SYNTHESIS EXAMPLE 1, there was charged 300 parts of 2-methylresorcin, 700 parts of paracresol and 580 parts of 85% paraformaldehyde. Lead acetate was added to adjust the pH of the reaction system to 6.3, and then the reaction mixture was heated to a refluxing temperature and maintained for 3 hours. Then, under normal pressure, water was distilled off and the mixture was heated to 118° C. Further, under a reduced pressure of 35 to 55 Torr, the mixture was heated to 120° C. to distill water off. Phenolic resol having benzylic ether linkage was obtained.

SYNTHESIS EXAMPLE 6

To the same reactor as used in SYNTHESIS EXAMPLE 1, there was charged 800 parts of phenol, 200 parts of 60% metacresol and 440 parts of 80% paraformaldehyde. Zinc naphthenate was added to adjust a pH of the reaction system to 6.0, and then the reaction mixture was heated to a refluxing temperature and maintained for 4.5 hours. Then, under normal pressure, the mixture was heated to 123° C. to distill water off. Phenolic resol having benzylic ether linkage was obtained.

COMPARATIVE EXAMPLE 1

To the same reactor as used in SYNTHESIS EXAMPLE 1, there was charged 1,000 parts of phenol and 950 parts of 37% formalin. 45 Parts of 25% ammonia water was added and the mixture was heated to a refluxing temperature and maintained for one hour. Under the reduced pressure of 80 to 100 Torr, water was distilled off and the mixture was heated to 78° C. Further, under 30 to 45 Torr, the mixture was heated to 85° C. to distill water off. Conventional phenolic resol was obtained.

COMPARATIVE EXAMPLE 2

To the same reactor as used in SYNTHESIS EXAMPLE 1, there was charged 700 parts of phenol, 300 parts of 60% metacresol and 1,240 parts of 37% formalin. 40 Parts of 25% sodium hydroxide and 30 parts of 25% ammonia water were added. The mixture was heated to a refluxing temperature and maintained for 55 minutes. After that, the same procedure as in COMPARATIVE EXAMPLE 1 was repeated. Conventional phenolic resol was obtained.

COMPARATIVE EXAMPLE 3

To the same reactor as used in SYNTHESIS EXAMPLE 1, there was charged 1,000 parts of 60% metacresol and 560 parts of 37% formalin. 5 Parts of oxalic acid was added and the mixture was refluxed for 90 minutes. Under normal pressure, water was distilled off and the mixture was heated to 150° C. Further, under 30 to 45 Torr, water was distilled off. Cresolic novolak was obtained.

Gel times of the phenol resins obtained in SYNTHESIS EXAMPLES 1, 2, 3, 4, 5 and 6 and COMPARATIVE EXAMPLES 1, 2 and 3 were determined by the 150° C. heat plate method of JIS K6909. The results are shown in Table 1.

TABLE 1

| RESIN | SYNTHESIS EXAMPLES | | | | | | COMPARATIVE EXAMPLE | | |
|---|---|---|---|---|---|---|---|---|---|
| | 1 | 2 | 3 | 4 | 5 | 6 | 1 | 2 | 3 |
| Gel time (second/150° C.) | 332 | 420 | 361 | 380 | 410 | 202 | 52 | 63 | none |

The phenolic resols having dibenzylic ether linkage obtained in SYNTHESIS EXAMPLES 1, 2, 3, 4, 5 and 6 have longer gel times and are excellent in heat stability as compared with conventional phenolic resols obtained in COMPARATIVE EXAMPLES 1, 2 and 3.

$1_{H-NMR}$ spectrum analysis was conducted to determine the forms of linkages to phenolic nucleus as to the phenolic resols obtained in SYNTHESIS EXAMPLES 1, 2, 3, 4, 5 and 6 are COMPARATIVE EXAMPLES 1, 2 and 3. The results are as shown in Table 2.

TABLE 2

| Form of linkage | SYNTHESIS EXAMPLE | | | | | | COMPARATIVE EXAMPLE | | |
|---|---|---|---|---|---|---|---|---|---|
| | 1 | 2 | 3 | 4 | 5 | 6 | 1 | 2 | 3 |
| —CH$_2$OCH$_2$— | 29 | 45 | 48 | 50 | 43 | 18 | 7 | 9 | 0 |
| —CH$_2$— | 40 | 30 | 31 | 28 | 31 | 52 | 54 | 48 | 100 |
| —CH$_2$OH | 31 | 25 | 21 | 22 | 26 | 29 | 39 | 43 | 0 |

The content of dibenzylic ether linkage of the phenolic resols obtained in SYNTHESIS EXAMPLES 1, 2, 3, 4, 5 and 6 is very high as compared with those obtained in COMPARATIVE EXAMPLES 1, 2 and 3. The resols having less than 15 mol. % of dibenzylic ether linkage are poor in heat stability and stability over time.

The phenolic resols are suitably contained in the light-sensitive composition of this invention in an amount of 2 to 98, preferably 5 to 95 wt.%.

LIGHT-SENSITIVE COMPOSITION

The light-sensitive composition of this invention comprising the above-mentioned phenolic resol as a binder will now be described.

(1) Compositions comprising diazo resin

There can be used both water-soluble and water-insoluble diazo resins, one representative example of which is a condensate between p-diazodiphenylamine and paraformaldehyde. Preferably, there may be used those which are insoluble in water but are soluble in conventional organic solvents. Particularly desirable diazo compounds are those having two or more diazo groups in a molecule, such as salts of a condensate between p-diazodiphenylamine and formaldehyde or acetaldehyde, e.g. salts of phenol, salts of fluorocapric acid and salts of sulfonic acids, such as triisoproylnaphthalenesulfonic acid, 4,4-biphenyldisulfonic acid, 5-nitro-ortho-toluenesulfonic acid, 5-sulfosalicylic acid, 2,5- dimethylbenzenesulfonic acid, 2-nitrobenzenesulfonic acid, 3-chlorobenzenesulfonic acid, 3-bromobenzenesulfonic acid, 2-chloro-5-nitrobenzenesulfonic acid, 2-fluorocaprylnaphthalenesulfonic acid, 1-naphthol-5-sulfonic acid, 2-methoxy-4-hydroxy-5-benzoyl-benzenesulfonic acid, paratoluenesulfonic acid, etc. In addition, desirable diazo resins include salts between 2,5-dimethoxy-4-p-tolylmercaptobenzene-diazonium/formaldehyde condensate or 2,5-dimethoxy-4-morpholinobenzenediazonium/formaldehyde or acetaldehyde condensate and the acids described above.

The diazo resin as described in British Pat. No. 1,312,925 can also be preferably used.

These diazo resins may be used alone to form a light-sensitive composition for use in making resist but are preferably used in combination with a binder.

As such a binder, there may be used various high-molecular compounds, preferably having hydroxy, amino, carboxyl, amido, sulfonamido, active methylene, thioalcohol or epoxy group, etc. Examples of preferable binders include shellac as described in British Pat. No. 1,350,521; polymers having, as a main repeating unit, hydroxyethylacrylate or hydroxyethylmethacrylate unit as described in British Pat. No. 1,460,978 and U.S. Pat. No. 4,123,276; polyamide resin as described in U.S. Pat. No. 3,751,257; phenol resin and polyvinyl acetal resin such as polyvinyl formal and polyvinyl butyral resins as described in British Pat. No. 1,074,392; linear polyurethane resin as described in U.S. Pat. No. 3,660,097; polyvinyl alcohol phthalated resin, epoxy resin derived from bisphenol A and epichlorohydrin, polymers having amino group such as polyaminostyrene and polyalkylamino(metha)acrylate, celluloses such as cellulose acetate, cellulose alkylether, cellulose acetate phthalate.

The amount of binder comprising the phenolic resol according to this invention contained in the light-sensitive composition is 30 to 95 wt.% based on the total amount of the composition, preferably about 40 to 90 wt.%.

The composition comprising the diazo resin may further contain additives such as phosphoric acid, dyes, pigments, etc. as described in U.S. Pat. No. 3,236,646.

(2) Compositions comprising o-quinone diazide compound

Preferable o-quinone diazide compounds used in this invention are o-naphthoquinone diazide compounds which are described in many publications including U.S. Pat. Nos.

2,766,118, 2,767,092, 2,772,972, 2,859,112, 2,907,665, 3,046,110, 3,046,111, 3,046,115, 3,046,118, 3,046,119, 3,046,120, 3,046,121, 3,046,122, 3,046,123, 3,061,430, 3,102,809, 3,106,465, 3,635,709 and 3,647,443. Among these compounds, o-naphthoquinone diazide sulfonates and o-naphtoquinone diazide carbonates of aromatic hydroxy compounds, and o-naphthoquinone diazide sulfonamides and o-naphthoquinone diazide carbonates of aromatic amine compounds are preferable. Particularly preferred compounds are pyrogallol/acetone condensate esterified by o-naphthoquinone diazide sulfonic acid as described in U.S. Pat. No. 3,635,709; polyesters having hydroxyl groups at the terminal ends and esterified by o-naphthoquinone diazide sulfonic acid or o-naphthoquinone diazide carboxylic acid as described in U.S. Pat. No. 4,028,111; and homopolymers of p-hydroxystyrene or copolymers thereof with a copolymerizable monomer, esterified by o-naphthoquinone diazide sulfonic acid or o-naphthoquinone diazide carboxylic acid as described in British Pat. No. 1,494,043.

These o-quinonediazide compounds may be used alone, preferably in combination with alkali-soluble resins. Suitable examples of alkali soluble resins include phenolic novolak resins, specifically phenol-formaldehyde resin, o-cresol-formaldehyde resin, m-cresol-formaldehyde resin, etc. As described in U.S. Pat. No. 4,123,279, it is more desirable to use in a combination with the phenol resins described above, a condensate of formaldehyde and phenol or cresol substituted by alkyl having 3 to 8 carbon atoms, e.g. t-butyl phenolformaldehyde resin. The binder is contained in the range of about 50 to about 90, preferably 60 to 80 percent by weight on the basis of the total amount of the light-sensitive composition comprising the phenolic resol according to this invention.

This composition may contain, in addition to the phenolic resol according to this invention, one or more of polyvinylacetal such as polyvinylbutyral, linear polyurethane, anionic polyurethane, epoxy, nylon, polyester, acryl, etc., in an amount of 2 to 40 percent by weight. Further, pigments, dyes, plasticizers, etc. may be contained if desired.

(3) Compositions comprising light-sensitive azide compound

Suitable light-sensitive azide compounds include aromatic azide compounds wherein azide group is attached directly or through a carbonyl or sulfonyl group to the aromatic ring. These azide compounds photolyze to form nitrene which causes various reactions and finally forms an insoluble product. Preferable aromatic azide compounds include those having one or more groups such as azidophenyl, azidostyryl, azidobenzal, azidobenzoyl, azidocinnamoyl, etc., for example, 4,4'-diazidocalcon, 4-azido-4'-(4-azidobenzoyl-ethoxy)-calcon, N,N-bis-p-azidobenzal-p-phenylenediamine, 1,2,6-tri(4'-azidobenzoxy)hexane, 2-azido-3-chloro-benzoquinone, 2,4-diazido-4'-ethoxyazobenzene, 2,6-di(4'-azidobenzal)-4-methylcyclohexanone, 4,4'-diazidobenzophenone, 2,5-diazido-3,6-dichlorobenzoquinone, 2,5-bis(4-azidostyryl)-1,3,4-oxadiazole, 2-(4-azidocinnamoyl)thiophene, 2,5-di(4'-azido-benzal)cyclohexanone, 4,4'-diazidodiphenylmethane, 1-(4-azidophenyl)-5-furyl-2-penta-2,4-diene-1-one, 1-(4-azido-phenyl-5-(4-methoxyphenyl)-penta-1,4-diene-3-one, 1-(4-azidophenyl)-3-(1-naphthyl)propene-1-one, 1-(4-azidophenyl)-3-(4-dimethylaminophenyl)-propane-1-one, 1-(4-azidophenyl)-5-phenyl-1,4-pentadiene-3-one, 1-(4-azidophenyl)-3-(4-nitrophenyl)-2-propene-1-one, 1-(4-azidophenyl)-3-(2-furyl)-2-propene-1-one, 1,2,6-tri(4'-azidobenzoxy)hexane, 2,6-bis-(4-azidobenzylidine-p-t-butyl) cyclohexanone, 4,4'-diazidodibenzalacetone, 4,4'-diazidostilbene-2,2'-disulfonic acid, 4'-azidobenzalacetophenone-2-sulfonic acid, 4,4'-diazidostilbene-alpha-carboxylic acid, di-(4-azido-2'-hydroxy-benzal)acetone-2-sulfonic acid, 4-azidobenzalacetophenone-2-sulfonic acid, 2-azido-1,4-dibenzenesulfonylaminonaphthalene, 4,4'-diazidostilbene-2,2'-disulfonic acid anilide, etc.

In addition to these low-molecular weight aromatic azide compounds, there may be used azido group—containing polymers as described in Japanese Patent Publication Nos. Sho 44-9047, 44-31837, 45-9613, 45-24915 and 45-25713 and Japanese Patent Application (OPI) Nos. Sho 50-5102, 50-84302, 50-84303 and 53-12984.

These light-sensitive azide compounds are preferably used together with high-molecular compounds as a binder. Suitable binders are alkali-soluble resins such as natural resins, e.g. shellac and rosin, phenolic novolak resins, e.g. phenol-formaldehyde resin and m-cresol-formaldehyde resin, homopolymers of unsaturated carboxylic acid and copolymers thereof with polymerizable monomer, e.g. polyacrylic acid — polymethacrylic acid, methacrylic acid styrene copolymer, methacrylic acid methyl acrylate copolymer, and styrene-maleic anhydride copolymer, resin obtained by partially or completely saponifying polyvinyl acetate, followed by partially acetalizing with aldehydes such as acetaldehyde, benzaldehyde, hydroxybenzaldehyde, carboxybenzaldehyde, etc., and polyhydroxystyrene. Further, organic solvent soluble resins including cellulose alkylethers such as cellulose methylether, cellulose ethylether, etc. may also be used as a binder.

The amount of the binder comprising the phenolic resol according to this invention contained in the light-sensitive composition is preferably in the range of about 10 to about 90 percent by weight based on the total amount of the composition comprising the light-sensitive azide compound.

The composition comprising the light-sensitive azide compound may further include such additives as dyes, pigments, plasticizers, e.g. phtalic acid esters, phosphoric acid esters, aliphatic carboxylic acid esters, glycols, and sulfonamides, and sensitizers, e.g. Michler's ketone, 9-fluorenone, 1-nitropyrene, 1,8-dinitropyrene, 2-chloro-1,2-benzanthraquinone, 2-bromo-1,2-benzanthraquinone, pyrene-1,6-quinone, 2-chloro-1,8-phthaloylnaphthalene, and cyanoacridine.

(4) Compositions comprising high-molecular compounds having —CH=CH—CO— group in the main or side chain thereof Examples of the above compositions include those comprising light-sensitive polymer having —CH=CH—CO— group in the main or side chain of the polymer, e.g. polyesters, polyamides and polycarbonates, as described in U.S. Pat. Nos., 3,030,208, 3,707,373 and 3,453,237; those comprising light-sensitive polyesters derived from 2-properidene malonic acid compounds such as cinnamylidene malonic acid and bifunctional glycols, as described in U.S. Pat. Nos. 2,956,878 and 3,173,787; cinnamic acid esters of hydroxy-containing polymers such as polyvinyl alcohol, starch, cellulose and analogues thereof, as described in U.S. Pat. Nos. 2,690,966, 2,752,372 and 2,732,301. These compositions may further contain sensitizers, stabilizers, plasticizers, pigments, dyes, etc.

(5) Photopolymerizable compositions comprising addition-polymerizable unsaturated compounds These compositions comprise preferably, (a) a vinyl monomer having at least two terminal vinyl groups, (b) a photopolymerization initiator and (c) a high molecular compound as a binder.

Examples of a vinyl monomer of the component (a) include acrylic or methacrylic ester of polyol as described in Japanese Patent Publication Nos. Sho 35-5093, 35-14719 and 44-28727, such as, diethyleneglycol di(meth)acrylate, triethyleneglycol di(meth)acrylate, pentaerythritol tri(meth)acrylate, trimethylolpropane tri(meth)acrylate, etc. or bisacrylamide, such as, methylenebis(meth)acrylamide, ethylenebis(meth)acrylamide, etc., or unsaturated monomers having an urethane group, for example, a reaction product between diol mono(meth)acrylate and diisocyanate such as, di-(2'-methacryloxyethyl)-2,4-tolylene diurethane, di-(2'-acryloxyethyl)-trimethylene diurethane, etc.

Examples of a photopolymerization initiators of the component (b) include the compounds as described in J. Kosar, *Light-sensitive Systems,* Chap. 5, e.g., carbonyl compounds, organic sulfur compounds, persulfides, redox compounds, azo compounds, diazo compounds, halogen compounds, photo reducing dyes, etc. More specifically, those described in British Pat. No. 1,459,563.

As a binder of the component (c), there can be used various known polymers. Specific examples of such binders are described in U.S. Pat. No. 4,072,527. Particularly preferred as binders are chlorinated polyolefins as described in British Pat. No. 1,459,563.

The weight ratio of the component (a) to the component (c) comprising the phenolic resol according to this invention is in the range of 1:9 to 6:4. The component (b) is contained in an amount of 0.5 to 10 percent by weight on the basis of the amount of the component (a).

This photopolymerizable composition may further contain a heat-polymerization inhibitor, a plasticizer, a dye or a pigment.

(6) Compositions comprising acid decomposable compound

These compositions comprise preferably, (a) a compound which forms an acid upon irradiation with an actinic light, (b) an acid decomposable compound, and (c) a high molecular compound as a binder.

Examples of the acid forming compound of the component (a) include salts between diazonium, phosphonium, sulfonium, or iodonium, and $BF_4^-$, $PF_6^-$, $SbF_6^-$, $SiF_6^-$, or $ClO_4^-$, organic halogen compounds, orthoquinonediazido sulfonylchlorides, combination of organic metal to organic halogen compounds, and compounds which form an acid by photolysis as described in U.S. Pat. No. 3,779,778 and West German Pat. No. 2,610,842.

Examples of the acid decomposable compounds of the component (b) include acetals, 0-acetals, N-acetals (Japanese Patent Application (OPI) No. Sho 48-89003), orthoesters or amidoacetals (Japanese Patent Application (OPI) No. Sho 51-120714), polymers having acetal or ketal group in the main chain thereof (Japanese Patent Application (OPI) No. Sho 53-133429), enol-ethers (Japanese Patent Application (OPI) No. Sho 55-12995), N-acylimino carbonic acid (Japanese Patent Application (OPI) No. Sho 55-126236), polymers having orthoester group in the main chain thereof (Japanese Patent Application (OPI) No. Sho 56-17345), compounds having silylether groups (Japanese Patent Application (OPI) No. Sho 58-146095), etc.

As a binder of the component (c), alkali-soluble resins are preferred. Suitable examples of such alkali-soluble resins include phenolic novolak, more specifically phenol-formaldehyde resin, o-cresol-formaldehyde resin, m-cresol-formaldehyde resin, etc. Preferably together with the above-mentioned phenolic novolak, there is used condensation products between formaldehyde and a phenol or a cresol substituted by one or more alkyl groups having 3 to 8 carbon atoms, e.g., t-butylphenol-formaldehyde resin, as described in U.S. Pat. No. 4,123,279.

The binder comprising the phenolic resol according to this invention is contained in the light-sensitive composition in an amount of about 5 to about 98 percent by weight, preferably 20 to 95 percent by weight based on the total weight of the composition.

This composition may contain, in addition to the phenolic resol according to this invention, polyvinyl acetals, e.g., polyvinyl formal, or polyvinyl butyral, linear polyurethane resin, anionic polyurethane resin, epoxy resin, nylon, polyester resin, acryl resin, etc.) alone or in combination, suitably in an amount of 2 to 40 percent by weight.

This invention also provides a composition comprising a condensate of the phenolic resol mentioned above and an o-quinonediazido sulfonylhalide.

Examples of o-quinonediazido sulfonylhalides which can be used in this invention include 1,2-benzoquinone-2-diazido-4-sulfonylchloride, 1,2-naphthoquinone-2-diazido-4-sulfonylchloride, 1,2-naphthoquinone-2-diazido-5-sulfonylchloride, etc.

The condensates between sulfonylhalides, e.g., o-quinonediazido sulfonylchloride and the phenolic resol according to this invention can be prepared as follows.

Sulfonylhalide (e.g. chloride) of o-quinonediazide and the phenolic resol are dissolved in a solvent, e.g., dioxane, methyl ethyl ketone, tetrahydrofuran, dimethylformamide (DMF), etc.) and are stirred at a temperature between room temperature and 50° C. To the mixture, alkali e.g., sodium carbonate is added. Esterification is easily carried out. The weight ratio of the phenolic resol according to this invention to the acid chloride to be reacted therewith, is in the range of 1:0.1 to 0.2:1, most preferably 1:0.3 to 1:1.

Typical synthesis examples of the condensates between the o-quinonediazido compound and the phenolic resol are described below.

SYNTHESIS EXAMPLE 7

A solution of the phenolic resol (17 g) prepared in SYNTHESIS EXAMPLE 1 in 60 ml of methyl ethyl ketone/DMF (5/1) was added to a solution of 1,2-naphthoquinone-2-diazido-5-sulfonylchloride (17 g) in 90 ml of methyl ethyl ketone/DMF (5:1). The mixture was stirred at room temperature for one hour. Triethylamine (6.4 g) was dropwise added and then 5 ml of water was added. Triethylamine was used to adjust the pH of this reaction system to 6.0 to 6.5. The reaction mixture, with stirring, was poured into 1,200 ml of cold water. Precipitated yellow powder was filtered and collected. The powder was reprecipitated and dried to obtain purified powder (26 g). Degree of esterification of the resulting resin per unit skeleton was calculated from the UV spectrum and it was 46%.

SYNTHESIS EXAMPLE 8

A solution of the phenolic resol (20 g) prepared in SYNTHESIS EXAMPLE 3 in 60 ml of methyl ethyl ketone/DMF (5/1) was added to a solution of 1,2-naphthoquinone-2-diazido-5-sulfonylchloride (20 g) in 90 ml of methyl ethyl ketone/DMF (5/1). The mixture was stirred at room temperature for one hour. Triethylamine (7.5 g) was dropwise added and then water (5 ml) was added. Triethylamine was used to adjust the pH of the reaction system to 6.0–6.5. The reaction mixture, with stirring, was poured into 1,200 ml of cold water. Precipitated yellow powder was filtered and collected. The powder was reprecipitated and dried to obtain purified powder (30 g). Degree of esterification of the resulting resin per unit skelton was calculated from the UV spectrum and it was 49%.

COMPARATIVE EXAMPLE 4

A solution of the conventional phenolic resol (17 g) prepared in COMPARATIVE EXAMPLE 2 in 60 ml of methyl ethyl ketone/DMF (5/1) was added to a solution of 1,2-naphthoquinone-2-diazido-5-sulfonylchloride (17 g) in 90 ml of methyl ethyl ketone/DMF (5/1). The mixture was stirred at room temperature for one hour. Triethylamine (6.4 g) was dropwise added and then water (5 ml) was added. Triethylamine was used to adjust the pH of the reaction system to 6.0 - 6.5. The reaction mixture, with stirring, was poured into 1,200 ml of cold water. Precipitated yellow powder was filtered and collected. The powder was reprecipitated and dried to obtain purified powder (28 g). Degree of esterification of the resulting resin per unit skelton was calculated from the UV spectrum, and it was 47%.

COMPARATIVE EXAMPLE 5

A solution of the phenolic novolak (20 g) prepared in COMPARATIVE EXAMPLE 3 in 60 ml of methyl ethyl ketone/DMF (5/1) was added to a solution of 1,2-naphthoquinone-2-diazido-5-sulfonylchloride (20 g) in 90 ml of methyl ethyl ketone/DMF (5/1). The mixture was stirred at room temperature for one hour. Triethylamine (7.5 g) was dropwise added and then 5 ml of water was added. Triethylamine was used to adjust the pH of the reaction system to 6.0–6.5. The reaction mixture, with stirring, was poured into 1,200 ml of cold water. Precipitated yellow powder was filtered and collected. The powder was reprecipitated and dried to obtain purified powder (32 g). Degree of esterification of the resulting resin per unit skelton was calculated from the UV spectrum and it was 51%.

In this light-sensitive composition, the o-quinonediazido compound is contained in an amount of 2 to 60, preferably 5 to 40 percent by weight.

The light-sensitive composition may contain as a light-sensitive component only the o-quinonediazid compound but preferably may further contain known o-naphthoquinonediazid compounds.

Preferred one of known o-naphthoquinonediazid compounds is an ester of 1,2-naphthoquinone-2-diazio-5-sulfonylchloride and pyrogallol-acetone resin as described in Japanese Patent Publication No. 43-28403. Another suitable one of known o-naphthoquinonediazid compounds is an ester of 1,2-diazonaphthoquinone-sulfonylchloride and phenolformaldehyde resin. Examples of other known o-naphthoquinonediazid compounds which can be used in this composition are described in Japanese Patent Application (OPI) Nos. 47-5303, 48-63802, 48-63803, 48-96575, 49-38701 and 48-13354, Japanese Patent Publication Nos. 41-11222, 45-9610 and 49-17481, U.S. Pat. Nos. 2,797,213, 3,454,400, 3,544,323, 3,573,917, 3,674,495 and 3,785,825, British Pat. Nos. 1,227,602, 1,251,345, 1,267,005, 1,329,888 and 1,330,932 and German Pat. No. 854,890.

The total amount of the o-quinonediazid compound according to this invention and known o-naphthoquinonediazid compounds are in the range of 10 to 60 percent by weight, preferably 20 to 40 percent by weight based on the total amount of the light-sensitive composition of this invention.

This composition may contain alkali soluble polymers, such as phenolic novolak, phenol-modified xylene resin, polyhydroxystyrene, polyhalogenated hydroxystyrene, etc. This composition may contain the phenolic resol according to this invention. These alkali soluble polymers may be contained in an amount of less than 90 percent by weight based on the total amount of this composition.

The composition of this invention may contain cyclic acid anhydrides for increasing the speed, dyes or other fillers as agents or compositions for obtaining a visible image immediately after image-wise exposure, or image coloring agents.

As cyclic acid anhydrides, there can be mentioned phthalic anhydride, tetrahydrophthalic anhydride, hexahydrophthalic anhydride, 3,6-endo-oxy-Δ4-tetrahydrophthalic anhydride, tetrachlorophthalic anhydride, maleic anhydride, chloromaleic anhydride, α-phenylmaleic anhydride, succinic anhydride, pyromellitic dianhydride, etc., as described in U.S. Pat. No. 4,115,128. It is possible to make the speed about three times higher by the incorporation of 1 to 15 percent by weight of the cyclic acid anhydride to the light-sensitive composition.

This composition may further contain known high molecular compounds for further improving the abrasion resistance of coating. Such high molecular compounds include polyvinyl acetal resins such as polyvinyl formal or polyvinyl butyral, linear polyurethane resins, anionic polyurethane resins, epoxy resins, polyvinylchloride resins, nylons, polyester resins, polyvinylethers, acryl resins, etc., which can be used alone or in combination, preferably in an amount of 2 of 40 percent by weight.

The light-sensitive composition of this invention may further contain dyes for recognizing an image, pigments, plasticizers, compounds for increasing the acid forming efficiency of the acid forming compound (so-called sensitizer), etc. Suitable dyes are oil soluble dyes and basic dyes. More specifically, Oil yellow #101, Oil yellow #130, Oil pink #312, Oil green BG, Oil green #502, Oil red 5B, Oil blue BOS, Oil blue #603, Oil black BY, Oil black BS, Oil black T-505 (all of which are produced by ORIENT CHEMICAL INDUSTRY), crystal violet (CI 42555), methyl violet (CI 42535), rhodamine B (CI 45170B), marachite green (CI 42000), methylene blue (CI 52015), fuchsin, parafuchsin, Victoria blue -BH, Victoria pure blue BOH (HODOGAYA CHEMICAL INDUSTRY), which can be added to the composition alone or in combination in an amount of 0.3 to 15 percent by weight based on the total amount of the composition. Further, there can be added such compounds that form, upon exposure to light, a compound which interacts with these dyes to change the color thereof. For example, o-naphthoquinone-diazido-4-sulfonylhalide (Japanese Patent Application (OPI) No. Sho 50-36209), trihalomethyl-2-pyrone and trihalomethyl triazine (Japanese Patent Application (OPI) No. Sho 53-36223), various o-naphthoquinone diazido compounds (Japanese Patent Application (OPI) No. Sho 55-62444), 2-trihalomethyl-5-aryl-1,3,4-oxadiazole compounds (Japanese Patent Application (OPI) No. Sho 55-77742), etc., can be used alone or in combination in an amount of 0.3 to 15 percent by weight based on the total amount of the composition.

In addition, the composition of this invention may contain other various additives for various purposes, such as fillers, surfactants as coating aids, e.g. cellulose alkyl ethers, ethyleneoxide type surfactants (e.g. FC-430 and FC-431 produced by 3M Company), plasticizers for improving physical properties of coating, e.g. dibutyl phthalate, butyl glycolate, tricresyl phosphate, dioctyl adipate, etc. The addition of fillers makes it possible not only to improve the physical properties of coating, but also to make the surface of the light-sensitive layer matted, which improves vacuum contact between the plate and the original film and consequently, prevents the image from becoming indistinct. Such fillers include talcum powder, glass powder, clay, starch, wheat flour, corn powder, Teflon (trademark) powder, etc.

SUPPORT

As a support on which the light-sensitive composition of this invention is coated to make an image-forming material, there can be used aluminum plates having an appropriately treated surface, paper, plastic films and laminates thereof. As plastic film materials, there can be mentioned polyolefins such as polyethylene, polypropylene, etc., vinyl polymers such as polyvinyl acetate, polyvinylchloride, etc., polyesters such as polyethylene terephthalate, polyethylene-2,6-naphthalate, etc., and cellulose acetates such as cellulose triacetate. As laminates, there can be mentioned paper, coated on both sides with aluminum sheet having a treated surface, polyethylene terephthalate film, coated on one or both sides with aluminum sheet having a treated surface, polypropylene film, coated on one or both sides with aluminum sheet having treated surface, etc.

IMAGE-FORMING MATERIALS

The light-sensitive composition of this invention can be dissolved in a solvent and coated on a support and dried to obtain an image-forming material. As a solvent, ethylenedichloride, cyclohexanone, methyl ethyl ketone, methylcellosolve acetate, propyleneglycol monomethylether acetate, n-butyl propionate, 3,3-dimethyl-butyl acetate, 2-ethoxy tetrahydropyrane, ethyleneglycol-mono-t-butyl ether, toluene, ethyl acetate, 2-heptanone, 2,4-pentanedione, methyl cellosolve, ethyl cellosolve, acetone, methanol, dimethylformamide, dimethylsulfoxide, dioxane, tetrahydrofuran, water, etc., can be used alone or in combination. Solid content in the coating liquid is suitably in the range of 2 to 50 percent by weight. Coating is ordinarily carried out by means of a coating device such as gravure coater, bar coater, reverse roll coater, whirler, spinner, curtain coater, extrusion bead coater, slide bead coater, etc. For controlling the physical properties of the surface of the image-forming material, there may be provided a protective layer or mat layer which is soluble in or permeable to a developing solution.

The image-forming material thus prepared is image-wise exposed to actinic light. Sources of actinic light include mercury vapor lamp, metal halide lamp, xenon lamp, chemical lamp, carbon arc lamp, etc. There also may be used scanning exposure by means of high energy beam such as laser or electron beam. For producing the laser beam, there can be used a helium-neon laser, argon laser, krypton ion laser, helium-cadmium laser, etc.

As a developing agent for the light-sensitive composition of this invention, there can be used those described in Japanese Patent Publication Nos. Sho 56-42860, 49-14681, 47-39895 and 47-32682, Japanese Patent Application (OPI) Nos. Sho 50-26601, 57-136647, 56-153341, 52-143019, 55-59459 and 58-252064 U.S. Pat. Nos. 3,669,660, 3,707,373 and 3,645,732, German Patent Application (OLS) Nos. 3,100,259Al, and 2,809,774, British Pat. No. 1,322,325, DAS No. 1,447,946 and No. 1,622,297, etc. More specifically, an aqueous solution of inorganic alkali such as sodium silicate, potassium silicate, sodium hydroxide, potassium hydroxide, lithium hydroxide, sodium phosphate, disodium hydrogenphosphate, ammonium phosphate, diammonium hydrogenphosphate, sodium metasilicate, sodium bicarbonate or ammonia water, or organic alkali such as monoethanolamine or diethanolamine can suitably be used in a concentration of 0.1 to 10, preferably 0.5 to 5 percent by weight. The alkaline solution may further contain any surfactant or organic solvent such as alcohols, if desired.

HEAT-HARDENING OF IMAGE-FORMING MATERIAL

For increasing the printing durability of a printing plate obtained from the image-forming material, it is subjected to heat-hardening treatment which can be carried out by any of various known methods as described in e.g., Japanese Patent Publication No. Sho 47-44045. The printing plate prepared from the image-forming material comprising the light-sensitive composition of this invention can be easily heat-hardened as compared with that prepared from the prior art material, so that the printing durability thereof can be easily improved. For example, a printing plate obtained from the material comprising the light-sensitive composition of this invention can be heat-treated at a lower temperature if the time for heating is the same, or for a shorter time if the temperature is the same, to obtain a printing durability which is the same or higher level than the prior art printing plate. Typically, the printing plate obtained from the image-forming material of this invention can be treated at 140° C. to 260° C., particularly 150° C. to 210° C., for 20 seconds to 20 minutes, particularly 1 to 7 minutes to obtain the desired effect. It is to be understood that if a support which is stable even at a temperature higher than the upper limit mentioned above is used, the printing plate can be treated at such temperature higher than the upper limit. In this case, it is possible to further shorten the time for heat-treatment.

Generally, as the heating temperature becomes higher, non-image areas are liable to be contaminated. For avoiding this, pretreatment using a water soluble compound has been conducted prior to heat-treatment. Such pretreatment can also be applied to the printing plate obtained from the image-forming material of this invention but usually, it is unnecessary. If the printing plate obtained from the material of this invention is treated at a lower temperature, e.g., 140° C. to 210° C., non-image areas are seldom contaminated and if contaminant adheres to non-image areas, it can easily be removed. For these reasons, the pretreatment before heating can be ordinarily eliminated as for the printing plate obtained from the image-forming material of this invention.

The resinous image on the printing plate obtained from the image-forming material thus heat-treated becomes insoluble in various chemicals used in a plate making process or a press operation, such as various organic solvents, printing inks, plate cleaners, protection inks, etc., that is, it is excellent in chemical resistance.

As seen from the foregoing, this invention provides an image-forming material which has great latitude in development and excellent stability over time, and which can be heat-treated, after development, at a lower temperature, or for a shortened time. This invention also provides a printing plate which is excellent in printing durability and which gives no contamination on the printed matter.

EXAMPLES

This invention will now be explained with reference to non-restrictive examples.

EXAMPLE 1

2S aluminum plate of 0.3 mm thickness was degreased in 10% aqueous solution of trisodium phosphate at 80° C. for 30 seconds, grained by brushing with a nylon brush using pumice slurry, etched in a solution of sodium aluminate at 60° C. for 10 seconds, and washed with 3% aqueous solution of sodium hydrogensulfate. The plate was then anodized in 20% sulfuric acid at a current density of 2 A/dm$^2$ for 2 minutes, treated with 2.5% aqueous solution of sodium silicate at 70° C. for one minute, and then washed with water and dried. On the support, there was coated the following light-sensitive liquid using a whirler and dried at 100° C. for 2 minutes.

| | |
|---|---|
| Naphthoquinone-1,2-diazido(2)-5-sulfonic acid ester of acetone-pyrogallol resin (produced according to EXAMPLE 1 of U.S. Pat. No. 3,635,709) | 2.5 g |
| Cresolic novolak of COMPARATIVE EXAMPLE 3 | 3 g |
| Phenolic resol of SYNTHESIS EXAMPLE 1 | 2.5 g |
| Oil blue #603 (produced by ORIENT CHEMICAL INDUSTRY) | 0.4 g |
| Methyl ethyl ketone | 75 g |
| Cyclohexanone | 60 g |

The amount of coating was 2.5 g/m$^2$ after drying. This is referred to as SAMPLE A. For comparison, the same light-sensitive liquid, except that the phenolic resol was removed and the amount of the cresolic novolak of COMPARATIVE EXAMPLE 3 was increased to 5.5 g, was similarly coated and dried. The amount of coating was 2.5 g/m$^2$ after drying. This is referred to as SAMPLE B.

For further comparison, the same light-sensitive liquid, except that the phenolic resol of SYNTHESIS EXAMPLE 1 was replated by the conventional phenolic resol of COMPARATIVE EXAMPLE 1, was similarly coated and dried. The amount of coating was 2.5 g/m$^2$ after drying. This is referred to as SAMPLE C.

These light-sensitive plates were set in a printing frame and exposed to light through a positive transparency at a distance of 100 cm for 30 seconds using FUJI FILM PS Light (having as its light source a 3 KW TOSHIBA metal halide lamp MU 2000-2-OL and sold by FUJI PHOTO FILM CO., LTD.) and then developed with the following developer.

| | |
|---|---|
| JIS No. 1 sodium silicate | 10 g |
| Sodium metasilicate | 5 g |
| Water | 180 ml |

In SAMPLE A of this invention and comparative SAMPLE B, exposed areas were dissolved but unexposed areas were not dissolved to form an image. In comparative SAMPLE C, unexposed areas were also partly dissolved and did not form an image faithful to the original.

After washing with water, SAMPLES A and B were coated with 14° Be gum arabic solution and buff-dried. The printing plates thus obtained were stored for 7 days and then installed in a printing machine (HEIDELBERG G.T.O.) and printing was conducted.

SAMPLE A of this invention and comparative SAMPLE B gave 100,000 and 80,000 copies, respectively. Thus, SAMPLE A of this invention was found to be excellent in both developing properties and printing durability.

EXAMPLE 2

On the same support as used in EXAMPLE 1, the following light-sensitive liquid was coated using the whirler and dried for 2 minutes at 100° C.

| | |
|---|---|
| Naphthoquinone-1,2-diazido(2)-5-sulfonic acid ester of acetone-pyrogallol resin (produced according to EXAMPLE 1 of U.S. Pat. No. 3,635,709) | 3 g |
| Cresolic novolak of COMPARATIVE EXAMPLE 3 | 2.5 g |
| Phenolic resol of SYNTHESIS EXAMPLE 3 | 2.5 g |
| Oil blue #603 (produced by ORIENT CHEMICAL INDUSTRY) | 0.4 g |
| Methyl ethyl ketone | 75 g |
| Cyclohexanone | 60 g |

The amount of coating was 2.7 g/m$^2$ after drying. This is referred to as SAMPLE D. For comparison, the same light-sensitive liquid except that the phenolic resol of SYNTHESIS EXAMPLE 3 was replaced by the conventional phenolic resol of COMPARATIVE EXAMPLE 2, was similarly coated and dried. The amount of coating was 2.7 g/m$^2$ after drying. This is referred to a SAMPLE E. These SAMPLES D and E thus prepared and SAMPLE B prepared in EXAMPLE 1 were stored for 2 weeks in an air chamber maintained at 45° C. and 75% humidity. These light-sensitive plates were set in a printing frame and exposed to light through a positive transparency at a distance of 100 cm for 30 seconds using FUJI FILM PS Light having as its light source a 3 KW TOSHIBA metal halide lamp MU 2000-2-OL and sold by FUJI PHOTO FILM CO., LTD.) and then developed with the following developer.

| | |
|---|---|
| JIS No. 1 sodium silicate | 10 g |
| Sodium metasilicate | 5 g |
| Water | 180 ml |

After washing with water, each of these plates was coated with 14° Be gum arabic solution and buff-dried. Each of these printing plates thus obtained was installed in the printing machine (HEIDELBERG G.T.O.) and printing was conducted.

SAMPLE D of this invention and comparative SAMPLE B gave printed matters without contamination both before and after storage. In contrast, comparative SAMPLE E gave printed matters without contamination before storage, but gave printed matters with contamination after storage.

SAMPLE D of this invention and comparative SAMPLE B gave 80,000 and 60,000 copies, respectively. Thus, SAMPLE D of this invention was found to be excellent in both stability with time and printing durability.

EXAMPLE 3

SAMPLES A and B prepared in EXAMPLE 1, which had been image-wise exposed and developed, were heated at 200° C. for 4 minutes in an oven, coated with 14° Be gum arabic solution and then buff-dried. The printing plates A' and B' thus obtained were stored for 7 days and then installed in the printing machine (HEIDELBERG G.T.O.) and printing was conducted. SAMPLE A' of this invention gave 250,000 copies, while comparative SAMPLE B' gave only 100,000 copies. Further, SAMPLE A' became insoluble in such an organic solvent as methyl ethyl ketone, acetone or alcohol, that is, the chemical resistance of SAMPLE A' greatly increased.

EXAMPLES 4, 5 and 6.

SAMPLES A and D, comparative SAMPLE B prepared in EXAMPLES 1 and 2, which had been image-wise exposed and developed, were subjected to heat treatment under the following conditions. Each of these plates was installed in the printing machine (HEIDELBERG G.T.O.) and printing was carried out. Printing durability for each SAMPLE was evaluated. The results (the number of printed copies) are as shown in Table 3.

TABLE 3

| EX-AMPLE | HEAT TREATMENT | SAMPLE | | |
|---|---|---|---|---|
| | | A | D | B (comparative) |
| 4 | 160° C., 5 minutes | 200,000 | 180,000 | 80,000 |
| 5 | 190° C., 5 minutes | 250,000 | 230,000 | 85,000 |
| 6 | 240° C., 2 minutes | 350,000 | 320,000 | 110,000 |

Heat treatment of SAMPLES A and D remarkably increased the printing durability thereof.

EXAMPLE 7

A support was prepared by the method as described in Japanese Patent Application (OPI) No. Sho 56-28893. That is, an aluminum plate of 0.24 mm thickness was grained with a nylon brush and 400 mesh pumice slurry and washed well with water. The plate was etched in 10% sodium hydroxide aqueous solution at 70° C. for 60 seconds, washed with flowing water, neutralized with 20% HNO$_3$ and washed with water. The plate was then electrolytically grained in 1% HNO$_3$ aqueous solution using alternating sinusoidal current under conditions of: 160 Coulomb/dm$^2$, 12.7V of anodic voltage and 0.8 of a ratio of anodic electrical quantity to cathodic electrical quantity. The surface roughness was 0.6 μ (expressed by Ra). The plate was immersed in 30% H$_2$SO$_4$ at 55° C. for 2 minutes for desmutting and then anodized in 20% H$_2$SO$_4$ at a current density of 2 A/dm$^2$ for 2 minutes. The plate was then immersed in 2.5% sodium silicate aqueous solution at 70° C. for one minute, washed with water and dried. The support thus prepared was coated with the following light-sensitive liquid using the whirler and dried at 100° C. for 2 minutes.

| | |
|---|---|
| 2-Hydroxyethyl methacrylate copolymer (the same as used in EXAMPLE 1 of U.S. Pat. No. 4,123,276) | 0.2 g |
| 2-Methoxy-4-hydroxy-5-benzoyl-benzenesulfonic acid salt of a condensate of p-diazodiphenylamine and paraformaldehyde | 0.5 g |
| Penolic resol of SYNTHESIS EXAMPLE 3 | 0.4 g |
| Oil blue #603 (produced by ORIENT CHEMICAL INDUSTRY) | 0.03 g |
| 2-Methoxy ethanol | 6 g |
| Methanol | 6 g |
| Ethylenedichloride | 6 g |

The amount of coating was 2.3 g/m² after drying. This is referred to as SAMPLE F.

For comparison, the same light-sensitive liquid except that the phenolic resol of SYNTHESIS EXAMPLE 3 was removed and the amount of the 2-hydroxyethyl methacrylate copolymer was increased to 0.6g, was similarly coated and dried. The amount of coating was 2.3 g/m² after drying. This is referred to as SAMPLE G.

For further comparison, the same light-sensitive liquid, except that the phenolic resol of SYNTHESIS EXAMPLE 3 was replaced by the phenolic resol of COMPARATIVE EXAMPLE 2, was similarly coated and dried. The amount of coating was 2.3 g after drying. This is referred to as SAMPLE H.

SAMPLES F, G and H were stored in an air chamber at 45° C. and 75% humidity for 5 days.

These light-sensitive plates thus prepared were set in a printing frame and exposed to light through a negative transparency at a distance of 100 cm for 70 seconds using FUJI FILM PS Light (having as its light source a 3 KW TOSHIBA metal halide lamp MU 2000-2-OL), then immersed in the following developer at 25° C. for one minute and rubbed with sanitary cotton to remove the composition in unexposed areas. Printing plates were obtained.

| | |
|---|---|
| Sodium sulfite | 3 g |
| Benzyl alcohol | 30 g |
| Triethanolamine | 20 g |
| Monoethanolamine | 5 g |

After washing with water, each of these plates was coated with 14° Be gum arabic solution and buff-dried. Each of these plates thus treated was stored for 3 days and installed in the printing machine (HEIDELBERG G.T.O.) and printing was conducted. SAMPLES F and G gave printed matters without contamination but SAMPLE H gave those with contamination.

Each of SAMPLES F and G gave 50,000 copies.

For increasing the printing durability, SAMPLES F and G which had been image-wise exposed and developed, were heated in an oven at 210° C. for 5 minutes, then coated with 14° Be gum arabic solution and then buff-dried. The resulting plates F' and G' were stored for 3 days and then installed in the printing machine (HEIDELBERG G.T.O.). Printing was conducted. SAMPLE F' of this invention and comparative SAMPLE G' gave 120,000 and 55,000 copies, respectively. SAMPLE F' became insoluble in such an organic solvent as methyl ethyle ketone, acetone or alcohol. Thus the chemical resistance of SAMPLE F' remarkably increased.

EXAMPLE 8

On the same support as used in EXAMPLE 7, the following light-sensitive liquid was coated using the whirler and dried at 100° C. for 2 minutes.

| | |
|---|---|
| Poly (allyl methacrylate)/methacrylic acid (molar ratio 85/15) | 20 g |
| Phenolic resol of SYNTHESIS EXAMPLE 2 | 12.5 g |
| Pentaerythritol tetraacrylate | 17.5 g |
| 2-trichlormethyl-5-(p-n-butoxystyryl) 1,3,4-oxadiazol | 2 g |
| Oil soluble blue dye (CI 42595) | 0.8 g |
| Sodium dilaurylsulfosuccinate | 3 g |
| Ethylenedichloride | 150 g |
| Methyl ethyl ketone | 150 g |

The amount of coating was 2.2 g/m² after drying. This is referred to as SAMPLE 1.

For comparison, the same light-sensitive liquid except that the phenolic resol of SYNTHESIS EXAMPLE 2 was removed and the amount of poly (allyl methacrylate)/methacrylic acid (molar ratio 85/15) was increased to 32.5 g, was similarly coated and dried. The amount of coating was 2.2 g/m² after drying. This is referred to as SAMPLE J.

For further comparison, the same light-sensitive liquid except that the phenolic resol of SYNTHESIS EXAMPLE 2 was replaced by the phenolic resol of COMPARATIVE EXAMPLE 2, was similarly coated and dried. The amount of coating was 2.2 g/m² after drying. This is referred to as SAMPLE K.

SAMPLES I, J and K were stored for 5 days in an air chamber at 45° C. and 75% humidity.

Each of SAMPLES I, J and K thus prepared was exposed to light through a negative transparency using BERKEY PRINTER produced by BERKEY TECHNICAL INC. (ASCOR ADALUX 2 kW), immersed in the following developer at room temperature for 50 seconds and then rubbed with sanitary cotton. Printing plates were obtained.

| | |
|---|---|
| Sodium sulfite | 5 g |
| Benzyl alcohol | 30 g |
| Sodium carbonate | 5 g |
| Sodium isopropylnaphthalene-sulfonate | 12 g |
| Water | 1,000 g |

After being stored for 3 days, each of these plates was installed in a printing machine (HEIDELBERG G.T.O.) and printing was conducted. SAMPLES I and H gave printed matter without contamination but SAMPLE K gave those with contamination.

Each of SAMPLES I and J gave 70,000 copies.

For increasing the printing durability, SAMPLES I and J which had been image-wise exposed and developed were heated in an oven at 220° C. for 3 minutes, then coated with 14° Be gum arabic solution and buff-dried. The resulting plates I' and J' were stored for 3 days and then installed in the printing machine (HEIDELBERG G.T.O.). Printing was conducted. SAMPLE I' of this invention gave 150,000 copies which is far greater than 75,000 copies given by comparative SAMPLE J'.

EXAMPLE 9

On the same support as used in EXAMPLE I, the following light-sensitive liquid was coated using the, whirler and dried at 100° C. for 2 minutes.

| | |
|---|---|
| Compound of SYNTHESIS EXAMPLE 7 | 2.5 g |
| Cresolic novolak of COMPARATIVE EXAMPLE 3 | 5.5 g |
| Oil blue #603 (produced by ORIENT CHEMICAL INDUSTRY) | 0.1 g |
| Methyl ethyl ketone | 75 g |
| Cyclohexanone | 60 g |

The amount of coating was 2.5 g/m² after drying. This is referred to as SAMPLE 1.

For comparison, the same light-sensitive liquid, except that the compound of SYNTHESIS EXAMPLE 7 was replaced by the compound of COMPARATIVE EXAMPLE 5, was similarly coated and dried. The amount of coating was 2.5 g/m² after drying. This is referred to as SAMPLE M.

Each of the resulting light-sensitive plates was set in a printing frame and exposed to light through a positive transparency at a distance of 100 cm using FUJI FILM PS Light (having as its light source a 3 KW TOSHIBA metal halide lamp MU 2000-2-OL and sold by FUJI PHOTO FILM CO., LTD.), then developed with the following developer.

| JIS No. 1 sodium silicate | 10 g |
|---|---|
| Sodium metasilicate | 5 g |
| Water | 180 ml |

After development, SAMPLES L and M were heated in an oven, coated with 14° Be gum arabic solution and buff-dried. The resulting plates were stored for 7 days and then installed in the printing machine (HEIDELBERG G.T.O.). Printing was conducted. Heating conditions and durability (the number of printed copies) for SAMPLE L and comparative SAMPLE M are as shown in Table 4.

TABLE 4

| HEATING | SAMPLE L | SAMPLE M (comparative) |
|---|---|---|
| 180° C., 6 minutes | 180,000 | 100,000 |
| 200° C., 4 minutes | 230,000 | 110,000 |
| 220° C., 2 minutes | 270,000 | 130,000 |
| no heating | 95,000 | 95,000 |

The printing durability of SAMPLE L remarkably increased by heat treatment at a lower temperature, or for a shortened time. After heat treatment SAMPLE L became insoluble in such an organic solvent as methyl ethyl ketone, acetone or alcohol, that is, the chemical resistance thereof remarkably increased.

EXAMPLE 10

On the same support as used in EXAMPLE 1, the following light-sensitive liquid was coated using the whirler and dried at 100° C. for 2 minutes.

| Compound of SYNTHESIS EXAMPLE 8 | 2.4 g |
|---|---|
| Cresolic novolak of COMPARATIVE EXAMPLE 3 | 5.5 g |
| Oil blue #603 (produced by ORIENT CHEMICAL INDUSTRY) | 0.1 g |
| Methyl ethyl ketone | 75 g |
| Cyclohexanone | 60 g |

The amount of coating was 2.6 g after drying. This is referred to as SAMPLE N.

For comparison, the same light-sensitive liquid except that the compound of SYNTHESIS EXAMPLE 8 was replaced by the compound of COMPARATIVE EXAMPLE 4, was similarly coated and dried. The amount of coating was 2.6 g/m² after drying. This is referred to as SAMPLE O.

SAMPLES N and O, and SAMPLES L and M prepared in EXAMPLE 9 were stored in an air chamber at 45° C. and 75% humidity for 10 days.

The resulting light-sensitive plates were image-wise exposed, developed and coated with the gum arabic solution in a similar manner to EXAMPLE 9. Each of the resulting printing plates was installed in the printing machine (HEIDELBERG G.T.O.).

SAMPLES L and N of this invention and comparative SAMPLE M gave printed matters without contamination both before and after the storage in the air chamber. In contrast, comparative SAMPLE O gave printed matters without contamination before the storage in the air chamber but gave those with contamination after the storage.

On the other hand, SAMPLE N of this invention was heated in an oven at 190° C. for 3 minutes, then coated with 14° Be gum arabic solution and buff-dried.

The resulting printing plate was installed in the printing machine (HEIDELBERG G.T.O.) and printing was conducted. The number of copies printed was 200,000 which is far greater than 90,000 obtained before heat treatment. Thus, SAMPLE N of this invention was found to be excellent in stability over time, and the printing durability thereof can be increased by a burning-in process at a lower temperature.

What I claim is:

1. A light sensitive composition (i) a phenolic resol wherein the ratio of the number of dibenzylic ether linkages to the total number of dibenzylic ether, methylene and methylol linkages linked to phenolic nucleus is 15 mol. % or more and which phenolic resol is obtained by a reaction between at least one phenol of the formula (I):

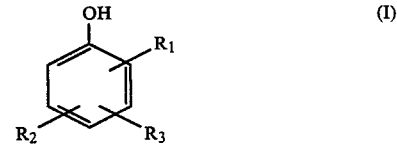

wherein $R_1$, $R_2$ and $R_3$ may be the same or different and represent a hydrogen, halogen, hydroxyl, nitro, alkyl having 1 to 20 carbon atoms, alkoxy having 1 to 20 carbon atoms, phenyl having 6 to 20 carbon atoms, or substituted phenyl having 6 to 20 carbon atoms, and an aldehyde and/or ketone under neutral or weakly acidic conditions and subsequent removal of water, and (ii) at least one member selected from the group consisting of diazo resins, o-quinone diazide compounds, light-sensitive azide compounds, high molecular compounds having a —CH=CH—CO— group in the main or side chain thereof, addition-polymerizable unsaturated compounds and acid-decomposition compounds, and wherein ingredients (i) and (ii) are together in admixture or as a light-sensitive esterified reaction product of the phenolic resol with o-quinone diazide sulfonyl halide.

2. A light-sensitive material which is in the form of a layer on a hydrophilic surface of a substrate thereby enabling a planographic printing plate to be obtained and includes a light-sensitive composition according to claim 1.

3. The light-sensitive composition of claim 1, wherein said aldehyde is selected from the group consisting of formaldehyde, paraformaldehyde, polyoxymethlene and mixtures thereof.

4. The light-sensitive composition of claim 1, wherein said phenolic resol is obtained in an amount of 2 to 98 percent by weight.

5. The light-sensitive composition of claim 1, wherein said o-quinone diazido sulfonyhalide is selected from the group consisting of 1,2-benzoquinone-2-diazido-4-sulfonylchloride, 1,2-naphthoquinone-2-diazido-4-sulfonylchloride and 1,2-naphthoquinone-2-diazido-5-sulfonylchloride.

6. The light-sensitive composition of claim 1, wherein said condensate is contained in an amount of 2 to 60 percent by weight.

7. The light-sensitive composition of claim 1, wherein said aldehyde is selected from the group consisting of formaldehyde, paraformaldehyde, polyoxymethylene and mixtures thereof.

8. The light-sensitive composition of claim 1, wherein said condensate is obtained by reacting said phenolic resol with said o-quinone diazido sulfonylhalide in the ratio of 1:0.1 to 0.2:1 by weight.

* * * * *